United States Patent
Kanschat et al.

(10) Patent No.: US 8,994,413 B2
(45) Date of Patent: Mar. 31, 2015

(54) METHOD FOR DRIVING POWER SEMICONDUCTOR SWITCHES

(71) Applicant: Infineon Technologies AG, Neubiberg (DE)

(72) Inventors: Peter Kanschat, Soest (DE); Andre Arens, Ruethen (DE); Hartmut Jasberg, Ottobrunn (DE); Ulrich Schwarzer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/871,288

(22) Filed: Apr. 26, 2013

(65) Prior Publication Data

US 2013/0285712 A1     Oct. 31, 2013

(30) Foreign Application Priority Data

Apr. 27, 2012  (DE) .......................... 10 2012 207 147

(51) Int. Cl.
*H03K 3/00*       (2006.01)
*H03K 17/00*      (2006.01)
*H03K 17/16*      (2006.01)

(52) U.S. Cl.
CPC .............. *H03K 17/00* (2013.01); *H03K 17/163* (2013.01); *H03K 17/168* (2013.01)
USPC .............. 327/109; 327/170; 326/83

(58) Field of Classification Search
CPC ................ H03K 19/00361; H03K 19/00384; H03K 5/12; H03K 17/04126; H03K 17/063; H03K 2217/0036; H04L 25/028; H04L 25/0272
USPC ....................... 327/170, 108–112; 326/82, 83
See application file for complete search history.

(56) References Cited

U.S. PATENT DOCUMENTS

| 4,540,893 | A | 9/1985 | Bloomer |
| 6,271,709 | B1 | 8/2001 | Kimura et al. |
| 7,570,102 | B2 * | 8/2009 | Tai ................................ 327/434 |
| 2006/0044025 | A1 | 3/2006 | Grbovic |
| 2010/0202165 | A1 | 8/2010 | Zheng et al. |

FOREIGN PATENT DOCUMENTS

| DE | 4329363 A1 | 3/1995 |
| DE | 19610895 A1 | 9/1997 |
| EP | 0814564 A1 | 12/1997 |

(Continued)

*Primary Examiner* — Lincoln Donovan
*Assistant Examiner* — Thomas Skibinski
(74) *Attorney, Agent, or Firm* — Murphy, Bilak & Homiller, PLLC

(57) ABSTRACT

A method for driving a controllable power semiconductor switch, having a first input terminal and first and second output terminals coupled to a voltage supply and a load, the first and second output terminals providing an output of the power semiconductor switch, includes adjusting a gradient of switch-off edges of an output current and an output voltage of the power semiconductor switch by a voltage source arrangement coupled to the input terminal. A gradient of switch-on edges of an output current and an output voltage is adjusted by a controllable current source arrangement that is coupled to the input terminal and generates a gate drive current. The profile of the gate drive current from one switching operation to a subsequent switching operation, beginning at a rise in the output current and ending at a decrease in the output voltage, is varied at most within a predefined tolerance band.

23 Claims, 5 Drawing Sheets

(56) References Cited

FOREIGN PATENT DOCUMENTS

| | | |
|---|---|---|
| JP | H1169780 A | 3/1999 |
| JP | 2002300016 A | 10/2002 |
| JP | 2002369553 A | 12/2002 |
| WO | 9423497 A1 | 10/1994 |

* cited by examiner

METHOD FOR DRIVING POWER SEMICONDUCTOR SWITCHES

PRIORITY CLAIM

This application claims priority to German Patent Application No. 10 2012 207 147.4, filed on 27 Apr. 2012, the content of said German application incorporated herein by reference in its entirety.

TECHNICAL FIELD

Embodiments described herein relate to methods and arrangements for driving controllable power semiconductor switches.

BACKGROUND

In power electronics, power semiconductor switches are often used to switch or control high magnitudes of voltage, current and/or power. Many different types of power semiconductor switches are known. Common power semiconductor switches include MOSFETs (metal oxide semiconductor field effect transistors), IGBTs (insulated gate bipolar transistor) and bipolar transistors. MOSFETs are advantageous in that a low-voltage input signal can be used. Bipolar transistors are advantageous in that a high reverse voltage strength and a low forward voltage with a high current density may be achieved. These advantages of bipolar transistors are due to the so-called bipolar effect. The bipolar effect greatly increases specific conductivity of a semiconductor region in comparison with the intrinsic conductivity of the region that is defined by the basic doping. This is due to charge-neutral bipolar flooding of electrons and holes. IGBTs combine some of the advantages of unipolar MOSFETs and bipolar transistors. For this reason, IGBT power semiconductor devices are often used in power electronics applications as electronic switches, and in particular applications that require blocking of voltages of more than 200 Volts.

The development of IGBTs has resulted in considerable improvement in performance and, in particular, an increase in current densities of the IGBTs during normal operation. Furthermore, the level of bipolar charge carrier flooding (so-called plasma) has also continuously increased in IGBTs to optimize the on-state properties. A side-effect of the increased plasma is that the intrinsic dynamics of evacuating plasma from the component dominates the voltage rise and the subsequent drop in the load current of the component under conventional drive conditions. As a result, the component's behavior deviates from quasi-steady state behavior (i.e. ideal transfer characteristics) determined by the MOS channel, particularly during switch-off. As a consequence, voltage and current transients are generally considerably steeper and therefore quicker during switch-on operations than during switch-off operations of the component.

Additionally, modern IGBT components are often designed to be limited by the pinch-off effect in the event of a short circuit to specific value, such as four times the nominal current density. This is done to prevent premature thermal destruction. This limitation in conjunction with a threshold voltage specific to the IGBT limits the gradient of the transfer characteristic curve. As a result, the position of the Miller plateau is greatly dependent on the switched load current of the component.

The above described switch-on properties of IGBTs are often a decisive factor in determining the electromagnetic compatibility (EMC) of an IGBT to a particular application. Different methods for controlling the switching speed of semiconductor switches are known. For example, controlled current sources designed to provide defined phase sections or ramps for a temporal gate-emitter voltage profile and for a feedback of the gate voltage signal, and circuits designed to control the collector voltage or the collector current to the drive circuit are known for this purpose. These known methods are described in further detail in the following publications: DE 43 29 363 A1, EP 0 814 564 A1, JP2002300016 A, JP11069780 A, U.S. Pat. No. 6,271,709 B1, US 2006/0044025 A1, WO 94/23497, JP2002369553 A, U.S. Pat. No. 4,540,893 and DE 196 10 895 A1.

However, the switching behavior of modern components when driven by known driving methods is highly dependent on the selected operating point of the device, and in particular the load current to be switched.

SUMMARY

According to an embodiment, a method for driving a controllable power semiconductor switch is provided. The power semiconductor switch has a first input terminal and first and second output terminals coupled to a voltage supply and a load. The first and second output terminals providing an output of the power semiconductor switch. The method includes adjusting a gradient of switch-off edges of an output current and an output voltage of the power semiconductor switch by a voltage source arrangement that is coupled to the input terminal. The method additionally includes adjusting a gradient of switch-on edges of an output current and an output voltage by a controllable current source arrangement that is coupled to the input terminal and generates a gate drive current. The profile of the gate drive current from one switching operation to a subsequent switching operation, beginning at a rise in the output current and ending at a decrease in the output voltage, is varied at most within a predefined tolerance band.

According to another embodiment, a circuit arrangement for driving a controllable power semiconductor switch is provided. The power semiconductor switch has a first input terminal, a first output terminal coupled to a first supply potential and a first and second output terminal. The first and second output terminals provide an output of the circuit arrangement. The circuit arrangement includes a voltage source arrangement coupled to the input and configured to adjust the gradient of switch-off edges of an output current and an output voltage of the power semiconductor switch. The circuit arrangement additionally includes a current source arrangement coupled to the input and configured to adjust the gradient of the switch-on edges of the output current and the output voltage of the power semiconductor switch by generating a gate drive current at the input of the power semiconductor switch. The circuit arrangement is configured to adjust the gate drive current from one switching operation to a following switching operation, beginning at a rise in the output current and ending at a decrease in the output voltage, within a predefined tolerance band.

Those skilled in the art will recognize additional features and advantages upon reading the following detailed description, and upon viewing the accompanying drawings.

BRIEF DESCRIPTION OF THE DRAWINGS

Embodiments of the invention are explained in more detail below using the figures of the drawings, in which case identical or similar elements are provided with the same reference symbols. In the drawings.

DETAILED DESCRIPTION

Figure 1:
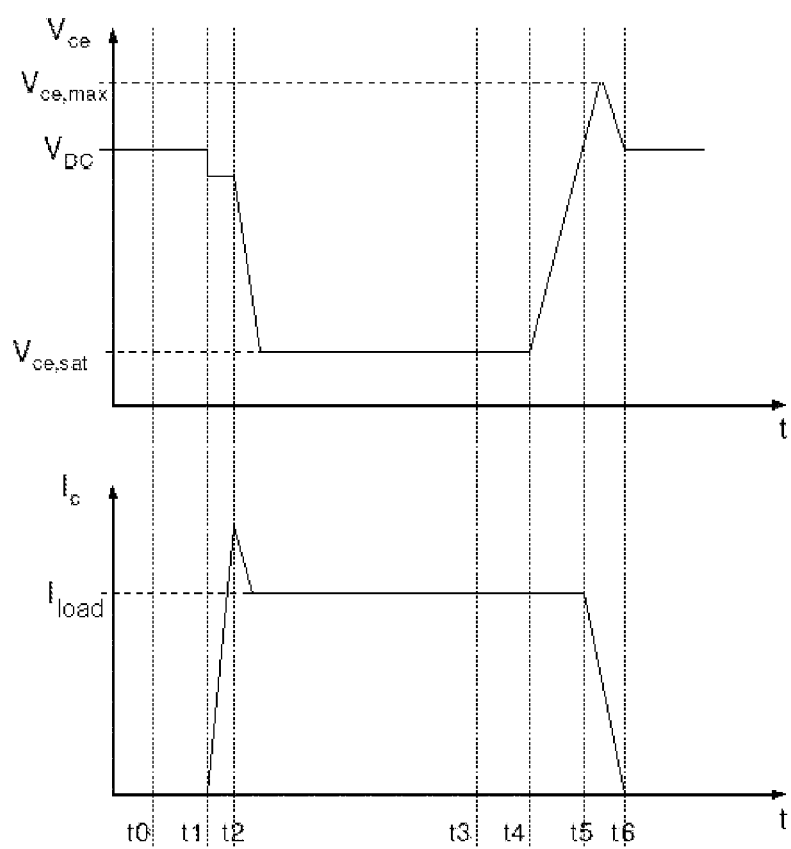
FIG. 1 shows an exemplary timing diagram of collector-emitter voltage and collector current in an IGBT when switching the IGBT on and off.

FIG. 1 depicts a timing diagram of collector-emitter voltage $V_{ce}$ and collector current $I_c$ in an exemplary IGBT during switching phases. At time $t_0$, the IGBT is switched to an off state. To switch the IGBT to an on state, a suitable temporal voltage profile must be applied to the control connection (gate) of the IGBT. At time $t_0$, a voltage is applied to the gate of the IGBT (not shown), thus beginning the switch-on operation. As a result, a gate-emitter voltage $V_{GE}$ (not shown) establishes at the gate of the IGBT. Capacitive charges that generally accumulate between the gate and collector and between the gate and emitter must be dissipated before the IGBT may be switched on. Furthermore, bipolar charge carriers must build up in the drift zone to allow the IGBT to conduct current. As a result, a rise in collector-emitter voltage $V_{ce}$ and collector current $I_c$ is not precisely contemporaneous with the change in gate-emitter voltage $V_{GE}$ and does not appear in FIG. 1 until time $t_1$. In the period of time between time $t_0$ and time $t_1$, the collector-emitter voltage $V_{ce}$ is at the applied supply voltage $V_{DC}$ and the collector current $I_c$ is at zero. The interval of time between time $t_0$ and time $t_1$ generally referred to as the switch-on delay time. During the switch-on delay time, the gate voltage of the IGBT (not shown) first rises to a threshold value. The collector current $I_c$ begins to rise at the time $t_1$ only after this threshold voltage has been reached. Thereafter, the collector-emitter voltage $V_{ce}$ still remains at a high value, minus a voltage drop due to leakage inductances in the current commutation path.

In the region between $t_1$ and $t_2$, the IGBT is in the active region and the collector current $I_c$ is substantially independent from the collector-emitter voltage $V_{ce}$. This state ends when the collector current $I_c$ reaches the load current intensity $I_{load}$. In many applications, a freewheeling diode is coupled between the emitter and the collector terminals of the IGBT and can be concomitantly integrated on the same chip. A voltage across the freewheeling diode begins at the time $t_2$. As a result of the voltage across the freewheeling diode, a reverse recovery effect occurs that causes a current peak in the collector current $I_c$. This current peak is due to the reaction of the diode to the current change. After the current peak is reached, the current is completely commutated from the freewheeling diode to the IGBT and the collector current $I_c$ assumes the value of the load current $I_{load}$.

After time $t_2$, the collector-emitter voltage $V_{ce}$ falls sharply, particularly after the above described current peak has been reached, until the IGBT is in the saturation region and assumes its saturation value $V_{ce,sat}$. At this time, the IGBT is completely switched on. Furthermore, at this time, the collector current $I_c$ is equal to the load current $L_{0ad}$ and the collector-emitter voltage $V_{ce}$ is at the saturation value $V_{ce,sat}$ until the switch-off operation begins at time $t_3$.

At time $t_3$, the voltage applied to the gate of the IGBT (not shown) is changed and the switch-off operation is thus started. Furthermore, at time $t_3$, there is no immediate change in the collector-emitter voltage $V_{ce}$ and the collector current $I_c$ due to gate-emitter capacitance and gate-collector capacitance.

At time $t_4$, the collector-emitter voltage $V_{ce}$ begins to rise. In this state, the rate of change of the collector-emitter voltage $dv_{ce}/dt$ is influenced by a magnitude of a gate current $I_G$ at the input (gate) of the IGBT. This state ends when the collector-emitter voltage $V_{ce}$ has reached the voltage $V_{DC}$ at time $t_5$.

At time $t_5$, the collector current $I_c$ begins to fall as the freewheeling diode begins to conduct the load current $I_{load}$. A transient change in the collector current $I_c$ in the commutation path containing leakage inductances gives rise to an overvoltage which causes the value of $V_{ce,max}$ at the IGBT.

At time $t_6$, after the collector-emitter overvoltage, the collector current $I_c$ is restored to its initial value. The IGBT is thus completely switched off again.

Suitable drive circuits may be configured to change or adapt the above described current and voltage edges during switching states, i.e. when the IGBT is switched on and off.

One method of adapting the above described current and voltage edges is a resistive driving method. According to this method, a gate current is injected into the gate with the aid of a voltage source and a series resistor.

Figure 2:
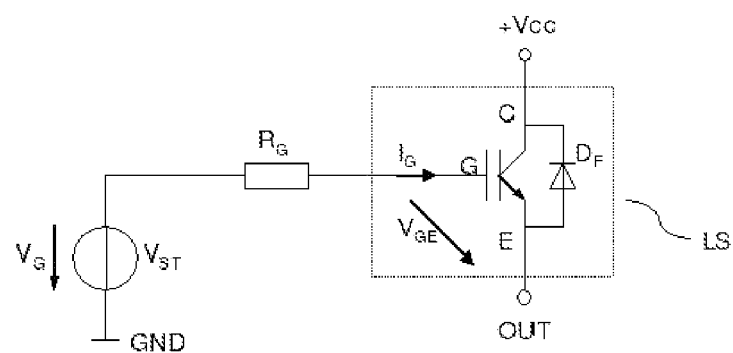
FIG. 2 shows an exemplary circuit configuration of a resistive driving circuit driving a power semiconductor switch.

FIG. 2 illustrates an example of a resistive driving method for an IGBT in a high-side arrangement. As shown, a power semiconductor switch LS is an IGBT. The collector C of the IGBT is coupled to a positive supply voltage +Vcc, and the emitter E is coupled to an output connection OUT. A diode $D_F$ is coupled between the collector C and the emitter E. The gate G is coupled to reference potential GND via a resistor $R_G$ and a voltage source $V_{ST}$. The voltage source $V_{ST}$ and the gate series resistor $R_G$ provide a gate current $I_G$ that reverses capacitive charges of the IGBT during the switching operations. Depending on the switching state, the gate current $I_G$ decisively determines the profiles of the rate of change of the collector current $di_c/dt$ and the rate of change of the collector-emitter voltage $dv_{ce}/dt$.

The resistive method fundamentally provides two adjustment parameters for influencing the switching behavior of the IGBT: a resistance of the gate series resistor $R_G$ and a magnitude of the gate control voltage $V_G$. For example, increasing the gate series resistance $R_G$ reduces the rate of change of the collector current $di_c/dt$ and the rate of change of the collector-emitter voltage $dv_{ce}/dt$. The reduced $di_c/dt$ results in a smaller reverse current peak of the diode and thus a reduction in the switching power loss of the IGBT when switching the IGBT "on."

The rate of change of the collector current $di_c/dt$ and the rate of change of the collector-emitter voltage $dv_{ce}/dt$ are inversely proportional to the switching energy losses of the IGBT. Thus, $di_c/dt$ and $dv_{ce}/dt$ are typically kept as high as possible for each switching operation to minimize switching losses. This may be achieved by a gate series resistance $R_G$ that is as small as possible. However, a maximum $di_c/dt$ may be limited by the characteristics of the freewheeling diode $D_F$ and requirements with regard to EMC (electromagnetic compatibility). Furthermore, a maximum $dv_{ce}/dt$ may also be limited by the winding insulations of connected machines and possible reflections on the supply lines in a particular application. Furthermore, the rate of change of the voltage $dv_{ce}/dt$ during switch-on on account of power-based EMC measurements may also need to be limited.

The second adjustment parameter, the gate control voltage $V_G$, should therefore be kept as large as possible within the capabilities of the IGBT in order to keep the energy losses as low as possible in the statically conductive state. However, sufficiently high values of the gate control voltage $V_G$ should not be exceeded so that the collector current is limited in the event of a short circuit.

Figure 3:
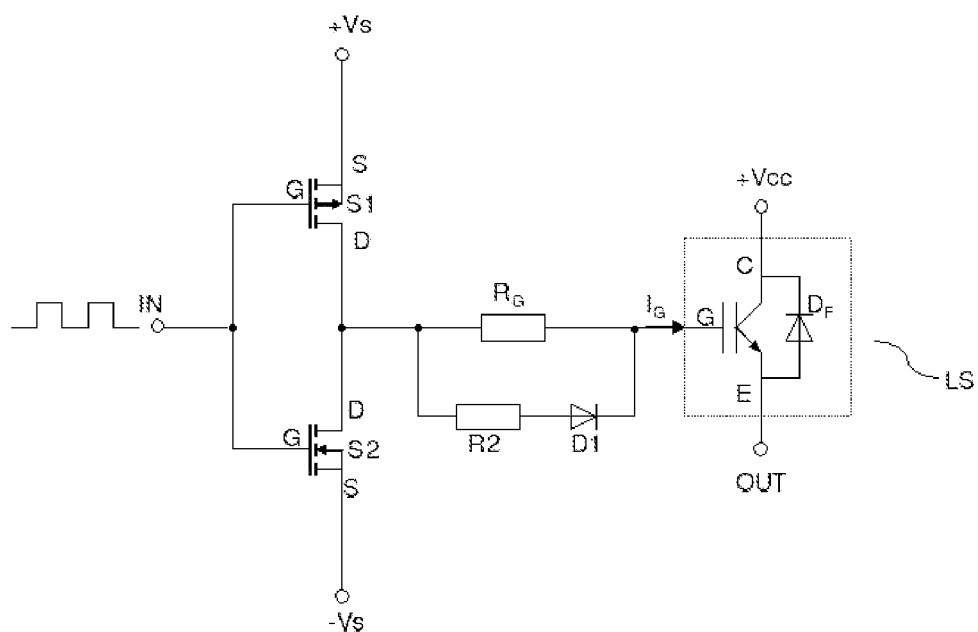
FIG. 3 shows an exemplary circuit configuration of a resistive driving circuit that includes a switching circuit driving a power semiconductor switch.

FIG. 3 depicts an exemplary embodiment of a resistive driving method for an IGBT in a high-side arrangement that includes a switching circuit. As shown, the gate series resistor $R_G$ is connected to between a first switch S1 and a second switch S2. The first switch S1 is connected to a positive potential +Vs and the second switch S2 is connected to a negative potential −Vs. The switches S1, S2 are switched by a control signal. The control signal is applied to an input connection IN that is connected to the control connections G of the switches S1, S2. The gate G of the power semiconductor switch LS can thus be connected to the positive potential +Vs by turning the switch S1 on and the switch S2 off and can be connected to the negative potential −Vs by turning switch S1 off turning the switch S2 on.

It may be preferable to separately influence the switch-on operation and the switch-off operation of the power semiconductor switch LS. FIG. 3 depicts a second resistor R2 and a diode D1 that may be connected in parallel with the gate series resistor $R_G$ to allow for different control signals of the power semiconductor switch LS. The diode D1 may be configured to conduct or block the positive voltage or the negative voltage and thus distinguish between different resistance values for a switch-on operation and a switch-off operation.

An alternative to the above described resistive driving method is a current-source based driving method. However, exclusively using a current source without a voltage source in a driving circuit has a variety of disadvantages. For this reason, current-source based driving methods often include both a voltage source and a current source.

Figure 4:
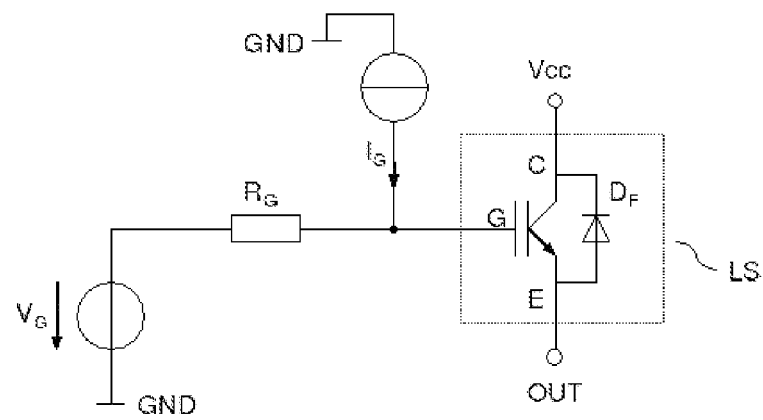
FIG. 4 shows an exemplary circuit configuration of a current source-based driving circuit driving a power semiconductor switch.

FIG. 4 shows a drive circuit that includes a resistive driving circuit with a voltage source and a current source. The circuit is configured similarly as the previously described embodiment of FIG. 2, and additionally includes a current source coupled between the control connection G of the power semiconductor switch LS and a reference potential GND. The power semiconductor switch LS is coupled to a supply voltage Vcc and an output connection OUT. In this example, the voltage source $V_{ST}$ and the series resistor $R_G$ provide the switch-off control stage and the current source $I_G$ provides the switch-on control stage. In this manner, the drive circuit can be advantageously adapted to modern power semiconductor switches, such as power semiconductor switch LS.

The parameters of the drive circuit may be set in such a manner that the switch-off behavior is substantially determined by the intrinsic dynamics of the power semiconductor switch used. For example, this may be achieved by providing a resistor $R_G$ with a relatively small gate resistance value $R_G$. In addition, the voltage source $V_{ST}$ may be designed to adjust the potential at the control connection G of the power semiconductor switch LS to 0 Volts or less after the conclusion of the switch-off operation. Furthermore, the potential at the control connection G of the power semiconductor switch LS may be adjusted to an intermediate value during a programmable time phase before the start of the switch-off operation. This intermediate value may be adjustable, for example, and may be 10, 11 or 12 Volts, for example.

Figure 5:
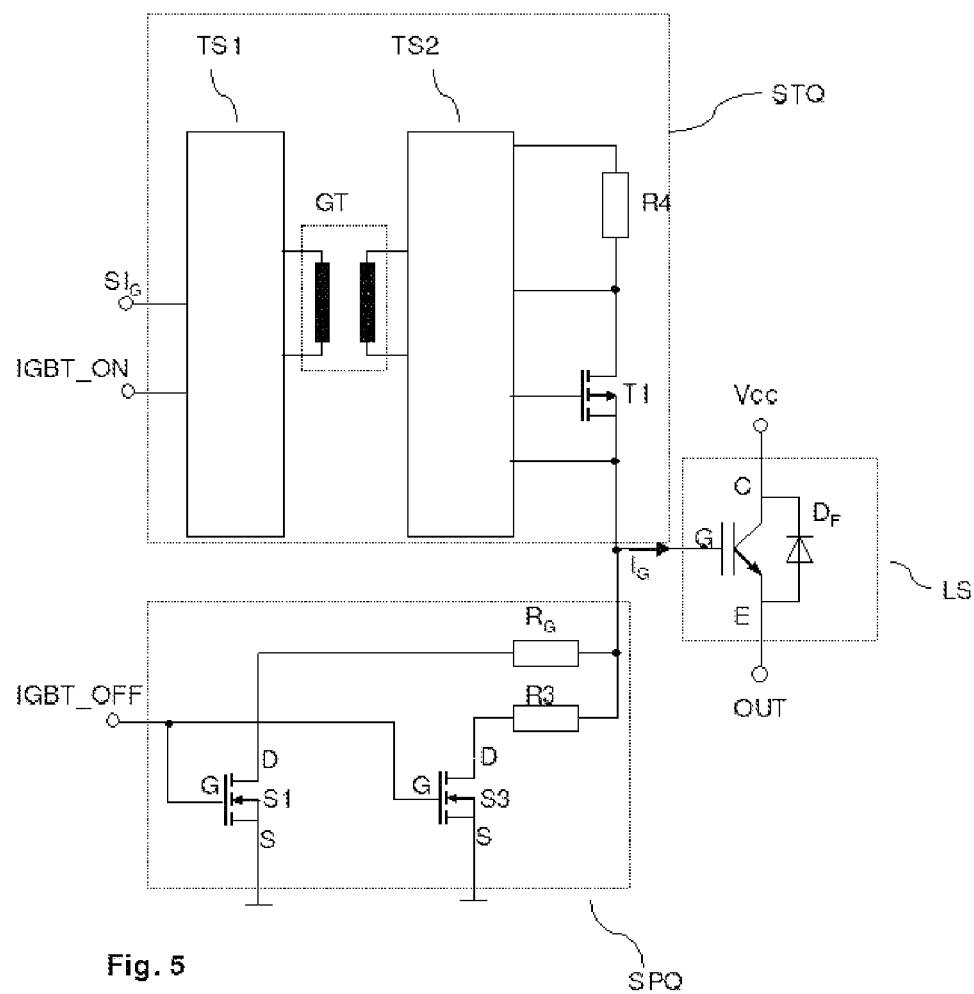
FIG. 5 shows an exemplary circuit configuration of a resistive driving circuit that includes switching devices and a multiple stage current source, according to an embodiment.

Referring to FIG. 5, an embodiment of a drive circuit including a resistive driving circuit that includes switching devices and a multiple stage current source is shown. As depicted, a voltage source arrangement SPQ provides a switch-off control. A gate series resistor $R_G$ is coupled in series with a first switch S1 between the control connection G of the power semiconductor switch LS and the reference potential GND to provide a first switch-off control. Additionally, a second switch-off control may be provided in parallel with the first switch-off control to provide high-impedance and slowly switch off the power semiconductor switch LS in the event of fault thus protecting the power semiconductor switch LS from overvoltage. As shown in FIG. 5, the second switch-off control consists of a second switch S3 and a second resistor R3 coupled in parallel with the first switch S1 and the gate series resistor $R_G$ between the control connection G of the power semiconductor switch LS and the reference potential GND.

The voltage source arrangement SPQ in the embodiment of FIG. 5 consists of the first switch-off control and the second switch-off control. In this arrangement, the power semiconductor switch LS can be switched in a low-impedance manner in nominal current ranges for the power semiconductor switch LS with the gate series resistor $R_G$. However, in high overcurrent ranges or short-circuit current ranges, the power semiconductor switch LS may be switched off via the second high-impedance switch-off control.

Figure 6:
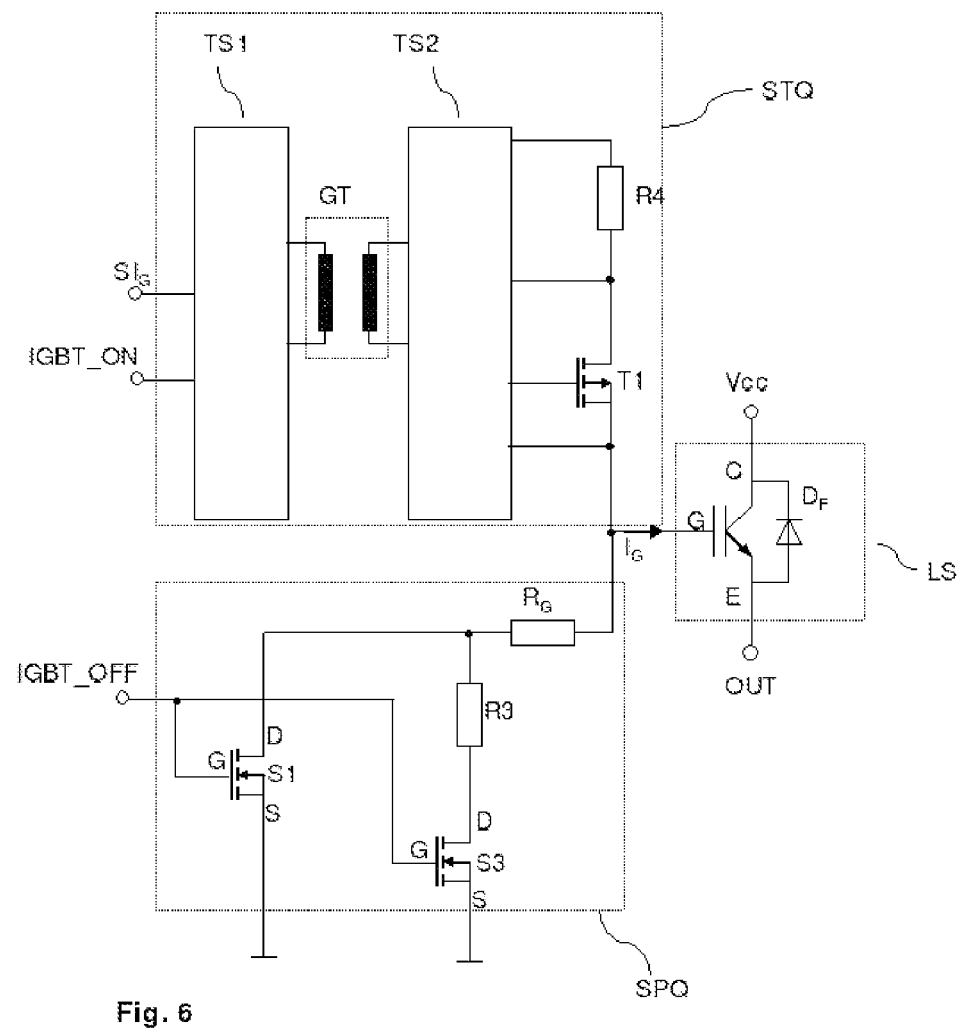
FIG. 6 shows an additional exemplary circuit configuration of a resistive driving circuit that includes switching devices and a multiple stage current source, according to an embodiment.

Referring to FIG. 6, an alternative embodiment of the voltage source arrangement SPQ is shown. As shown in FIG. 6, the additional switch S3 and the additional resistor R3 in series are connected in series with the gate series resistor $R_G$ and in parallel with the first switch S1.

The control connections G of the first and second switch-off control both switches S1 and S3 and are connected to an input of the voltage source arrangement SPQ. This input receives a signal IGBT_OFF that switches the power semiconductor switch LS off.

The switch-on control arrangement STQ may be configured as a current source to provide the gate drive current $I_G$. The current source of the switch-on control arrangement STQ may be designed in such a manner that the profile of the gate drive current $I_G$ may be varied within a predefined tolerance band from one switching operation a following switching operation. The gate drive current $I_G$ may be independent of the load current $I_{load}$ to be switched during the rise of the load current $I_{load}$ through the power semiconductor switch LS until the end of the fall of the collector-emitter voltage $V_{ce}$. Accordingly, the profile of the gate drive current $I_G$ can be respectively varied from one switching operation to the following switching operation. Alternatively, the profile of the gate drive current $I_G$ may remain the same across a defined number of successive switching operations and may be varied thereafter within the predefined tolerance band. In this manner, the speed of the switching edges may be adjusted, based on the collector current $I_G$ the collector-emitter voltage $V_{ce}$ and the junction temperature $T_j$ of the power semiconductor switch, to an optimal operating point.

The value of the predefined tolerance band may be limited for control reasons. For example, the tolerance band may be +/−20% of a preceding switching operation. However, different applications may not require control restrictions and in this instance a greater tolerance band is possible. For example, the tolerance band may not be based on the temperature and the voltage to be switched by the power semiconductor switch LS, if the temperature and voltage do not exceed usual operating ranges. The transient process, i.e. the period of time in which the accuracy of the gate drive current $I_G$, as described by the tolerance band may be less than 200 ns, for example.

The control connection G of the power semiconductor switch LS gate may be charged with a substantially constant current $I_G$ over a particular period of time, for example. However, a systematic deviation from the substantially constant current $I_G$ is also possible within the tolerance band. For example, deviations may result from transient or oscillation processes. Accordingly, a switching behavior of the power semiconductor switch LS may be optimized with respect to the switching losses and with respect to the electromagnetic compatibility.

The gate drive current $I_G$ actually produced should reach a predefined desired value $I_S$ within operational limits. In this case, approximation of the desired current value $I_S$ may be provided both starting from a larger value and starting from a smaller value. Approximation using a larger value may be desirable, for example, when the switching edges which are becoming faster are intended to be limited when reducing the collector current $I_c$. In contrast, approximation using a smaller value may be desirable, for example, when the collector current $I_c$ rises and the switching losses can be minimized thereby.

The accuracy of the adjusted gate drive current $I_G$ may be achieved in different ways. For example, it is possible to implement a current source circuit STQ in an integrated circuit (IC) configured to provide calibration. The calibration may be effected, for example, by means of programming or so-called "laser fusing" at the chip level. In this implementation, an integrated circuit with an external output stage may be provided, for example. In addition, it is possible to compensate for temperature changes with the aid of a temperature measurement inside the integrated circuit, for example.

The current $I_G$ actually applied to the gate may be measured with the aid of a sense resistor or a shunt resistor and a control loop. For example, the measurement may be carried out as an instantaneous value measurement, at a suitable time between the transient phase and the conclusion of the switching operation by the power semiconductor switch LS. The gate measuring time may be approximately 300 to 500 ns after a gate-emitter voltage of 0 V has been reached in the power semiconductor switch LS. The measured value obtained in this manner may then be stored and used in a comparison between a desired value and an actual value for adapting the driver current during subsequent switch-on operations. However, the measured value may also be used, for example, as a controlled variable for a real-time control loop to the desired value $I_S$. This can be implemented, for example, with the aid of an analog circuit.

FIG. 5 shows, in a simplified manner, a possible implementation the current source arrangement STQ with an input driver stage TS1 and an output driver stage TS2. These stages may be DC-isolated from one another, for example. A transformer GT, as depicted in FIG. 5 may be used for this purpose. However, DC-isolation is not necessarily required and thus alternate embodiments do not include the transformer GT. The output driver stage TS2 may have an external connection. For example, a control transistor T1 and a resistor R4 may be externally connected to the driver stage TS2.

The current source arrangement STQ shown in FIG. 5 is configured to adjust a preselected gate drive current value $I_G$. The gate drive current value $I_G$ may be adjusted from a starting time, e.g., the time at which the gate-emitter voltage of the power semiconductor switch LS assumes the value zero, and may be adjusted over a particular minimum duration thereafter. This minimum duration may be, for example, between 100 ns and 2 µs. However, the adjustment of a preselected gate drive current value $I_G$ may also be ended before reaching the set minimum duration in certain particular conditions. For example, the adjustment may be ended when the preselected gate voltage $I_S$ has been reached at the power semiconductor switch LS or, if external bipolar output stage transistor(s) are provided, when saturation of the external transistor(s) is detected. The level of the desired value of the gate current $I_S$ may be selected, for example, by applying a control signal $SI_G$ to the input of the driver circuit. Depending on the operating voltage, the current profile may consist of two to three phases, for example. The current source arrangement STQ further includes an input that is supplied with a signal IGBT_ON. The signal IGBT_ON switches the power semiconductor switch LS on.

An absolute value of the drive current value $I_G$ may be set, for example, by means of an external analog connection, for example by a suitable measuring resistor. In some applications, it may be desirable to adjust the voltage transients of the switch-on operation of the power semiconductor switch between 2 kV/µs and 10 kV/µs, for example, by providing a suitable external connection. In some applications, it may also be advantageous if the gate drive current $I_G$ can be adjusted in ten stages between a maximum value and a minimum value. In some applications, an additional eleventh stage may be used to activate an existing output stage, such as in a resistive driver arrangement, and to implement a push stage (voltage source driver).

The external control signal $SI_G$ can be supplied to the driver circuit TS1 e.g., by a digital interface or an analog input. If the DC-isolation GT is included in the current source arrangement STQ, information relating to the desired value of the switch-on gate current $I_G$ may also be transmitted thereby. In some applications, it may be advantageous if the transmission of the desired value of the switch-on gate current $I_S$ is synchronized with the switch-on pulses. In this instance, synchronous transmission of the complete information for each switching pulse or alternatively transmission of the complete information distributed over a plurality of switching pulses may be conceivable, for example.

A phase with a substantially constant gate charging current $I_G$ may be followed, for example, by a phase with a gate charging current $I_G$ increased by a multiple to fully charge the control connection G of the power semiconductor switch LS and to thus make it possible to achieve the final forward voltage of the power semiconductor switch LS at the earliest possible time.

If the driver stage TS2 includes a bipolar output stage transistor for the current source function, said transistor may be bridged in parallel with an MOS transistor with the constant gate drive current $I_G$, for example, at a time after the active switching phase. As a result, the gate voltage of the power semiconductor switch LS is continuously charged to the supply voltage of the gate driver stage. In this case, the MOS transistor can be integrated in the integrated circuit, for example.

If a voltage with a value of less than zero is selected for the switched-off state of the power semiconductor switch LS, the current source can be operated with a high output current, for example in a first phase, until a particular negative voltage is reached at the control connection G of the power semiconductor switch LS. This negative voltage may have a magnitude of more than −4 V, for example, and may be below a defined threshold value. For example, a value of between −3 and −2 V is possible as a trigger for changing the initially high charging current to a lower charging current in the active switching phase of the power semiconductor switch LS. In this case, the initially high charging current may be, for example, up to ten times the drive current in the active switching phase of the power semiconductor switch. In this case, an initial charging current that is selected to be high may be desirable, in particular, when the switch-on delay time is intended to be limited to a particular value.

Switching behavior of the power semiconductor switch LS may be optimized with respect to overvoltages and EMC may be achieved by using a drive circuit according to previously described embodiments. For example, the embodiments described allow the power semiconductor switch LS to be switched off with an uncontrolled, unregulated voltage source and for the power semiconductor switch LS to be switched on with the aid of multiphase, parameterizable current source control.

As shown in the embodiments depicted, the power semiconductor switch LS is an IGBT. However, the previously discussed driving methods and circuits are not limited to a power semiconductor switch LS that is an IGBTs. The methods and circuits described herein may be implemented with any switching device wherein the above described switching characteristics are desired. For example, the power semiconductor switch LS may be a MOSFET, bipolar transistor, etc.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for driving a controllable power semiconductor switch, the power semiconductor switch having a first input terminal and first and second output terminals coupled to a voltage supply and a load, the first and second output terminals providing an output of the power semiconductor switch, the method comprising:
    adjusting a gradient of switch-off edges of an output current and an output voltage of the power semiconductor switch by a voltage source arrangement coupled to the input terminal; and
    adjusting a gradient of switch-on edges of the output current and the output voltage by a controllable current source arrangement coupled to the input terminal and that generates a gate drive current, wherein a profile of the gate drive current from one switching operation to a subsequent switching operation, beginning at a rise in the output current and ending at a decrease in the output voltage, is varied at most within a predefined tolerance band;
    wherein the profile of the gate drive current is adjusted independent of a load current flowing across the first and second output terminals.

2. The method of claim 1, wherein the controllable power semiconductor switch is an insulated gate bipolar transistor (IGBT), the first input terminal is the gate terminal of the IGBT and the first and second output terminals are the collector and emitter terminals of the IGBT.

3. The method of claim 1, wherein the profile of the gate drive current is varied at most within the predefined tolerance band from one switching operation to an immediately following switching operation.

4. The method of claim 1, wherein the profile of the gate drive current is not varied from one switching operation to at least one immediately following switching operation, and after a designated number of switching operations thereafter, the profile is varied at most within the predefined tolerance band.

5. The method of claim 1, wherein the predefined tolerance band for a switching operation is at most +/−20% of the respective preceding switching operation.

6. The method of claim 1, wherein the tolerance band is maintained independent of the voltage to be switched at the output of the power semiconductor switch.

7. The method of claim 1, wherein the magnitude of the gate drive current is brought closer to a desired value within the predefined tolerance band by approximating a larger or smaller value based on at least one of a frequency of the switch-on edges and a current at the first or second output terminals.

8. The method of claim 1, further comprising:
    measuring an actual value of the gate drive current;
    comparing the actual value with a desired value; and
    adapting the gate driver current generated at the input terminal of the power semiconductor switch during the following switch-on operation, based on the comparison.

9. The method of claim 1, wherein the value of the gate drive current is adjusted over a predefined minimum duration.

10. The method of claim 9, wherein the value of the gate drive current ceases to be adjusted before reaching the minimum duration if one or more conditions are met.

11. The method of claim 10, wherein the one or more conditions comprise whether a specified voltage occurs at the first input terminal of the power semiconductor switch.

12. The method of claim 1, wherein the voltage source arrangement further comprises a gate series resistor configured such that the turn-off behavior of the power semiconductor switch is substantially determined by intrinsic properties of the power semiconductor switch.

13. The method of claim 1, wherein the adjustment of the gradient of switch-off edges is provided by the voltage source with a potential of less than or equal to 0 Volts at the input terminal.

14. The method of claim 1, wherein the adjustment of the gradient of switch-off edges is provided by a potential from the voltage source with an intermediate value in a programmable time phase before the start of a switch-off operation, the intermediate value between the input voltage in the switched-off state and the input voltage in the switched-on state.

15. The method of claim 1, wherein the voltage source arrangement further comprises a first switching device and a first gate series resistor in series between the input terminal of the power semiconductor switch and a reference potential.

16. The method of claim 15, wherein the voltage source arrangement further comprises a second switching device and a second gate series resistor in series between the input terminal of the power semiconductor switch and a reference potential and in parallel with the first switching device and the first gate series resistor.

17. The method of claim 15, wherein the voltage source arrangement further comprises a second switching device and a second gate series resistor in series between the input terminal of the power semiconductor switch, the first gate series resistor and a reference potential and in parallel with the first switching device.

18. A circuit arrangement for driving a controllable power semiconductor switch having a first input terminal, a first output terminal coupled to a first supply potential and a first and second output terminal, the first and second output terminals providing an output of the circuit arrangement, the circuit arrangement comprising:
- a voltage source arrangement coupled to the input and configured to adjust the gradient of switch-off edges of an output current and an output voltage of the power semiconductor switch; and
- a current source arrangement coupled to the input and configured to adjust the gradient of switch-on edges of the output current and the output voltage of the power semiconductor switch by generating a gate drive current at the input of the power semiconductor switch, wherein the circuit arrangement is configured to adjust the gate drive current from one switching operation to a following switching operation, beginning at a rise in the output current and ending at a decrease in the output voltage, within a predefined tolerance band;
- wherein the current source arrangement is decoupled from the first and second output terminals.

19. The circuit arrangement of claim 18, wherein the controllable power semiconductor switch is an insulated gate bipolar transistor (IGBT), the first input terminal is the gate terminal of the IGBT and the first and second output terminals are the collector and emitter terminals of the IGBT.

20. The circuit arrangement of claim 18, wherein the circuit arrangement is further configured to adjust the gate drive current to a desired value within the predefined tolerance band.

21. The circuit arrangement of claim 20, wherein the current source arrangement is configured to adjust the gate drive current to a desired value responsive to a control signal applied to a control signal input of the current source arrangement.

22. The circuit arrangement of claim 18, wherein the current source arrangement comprises an input driver stage and an output driver stage.

23. The circuit arrangement of claim 22, wherein the input driver stage and the output driver stage are DC isolated.

* * * * *